United States Patent [19]
Iino

[11] Patent Number: 6,162,292
[45] Date of Patent: Dec. 19, 2000

[54] METHOD OF PRODUCING SILICON MONOCRYSTAL

[75] Inventor: Eiichi Iino, Gunma-ken, Japan

[73] Assignee: Shin-Etsu Handotai Co., Ltd., Tokyo, Japan

[21] Appl. No.: 09/220,873

[22] Filed: Dec. 23, 1998

[30] Foreign Application Priority Data

Dec. 27, 1997 [JP] Japan ..................................... 9-368292
Jul. 13, 1998 [JP] Japan ................................. 10-213477

[51] Int. Cl.$^7$ ..................................................... C30B 15/36
[52] U.S. Cl. .................................................. 117/13; 117/35
[58] Field of Search ................................. 117/13, 11, 35

[56] References Cited

U.S. PATENT DOCUMENTS

| | | | |
|---|---|---|---|
| 4,592,895 | 6/1986 | Matsutani et al. | 422/106 |
| 5,477,806 | 12/1995 | Akashi et al. | 117/17 |
| 5,501,172 | 3/1996 | Murai et al. | 117/15 |
| 5,885,344 | 3/1999 | Kim et al. | 117/13 |
| 5,911,822 | 6/1999 | Abe et al. | 117/13 |

FOREIGN PATENT DOCUMENTS

| | | | |
|---|---|---|---|
| 5139880 | 6/1993 | Japan . | |
| 9255485 | 9/1997 | Japan | C30B 15/36 |
| 10-203898 | 8/1998 | Japan | C30B 29/06 |

OTHER PUBLICATIONS

Wolf et al., Silicon Processing for the VLSI Era vol. 1: Process Technology, Lattice Press, Sunset Beach, Calif., USA, p. 18, 1986.

*Primary Examiner*—Benjamin L. Utech
*Assistant Examiner*—Matt Anderson
*Attorney, Agent, or Firm*—Hogan & Hartson, LLP

[57] ABSTRACT

There is disclosed a method of producing a silicon monocrystal using a Czochralski method in which a sharp tip end of a seed crystal is brought into contact with silicon melt and is melted, and the seed crystal is then pulled, without performance of a necking operation, in order to grow a silicon monocrystalline ingot below the seed crystal. The operation of melting the seed crystal into the silicon melt is performed in a state in which a temperature in the vicinity of the surface of the silicon melt is set in a range between a temperature 25° C. higher than the melting point of silicon and a temperature 45° C. higher than the melting point of silicon. The operation of growing the monocrystal is started within 0 to 10 minutes after completion of the operation of melting the sharp tip end of the seed crystal into the silicon melt. The monocrystal is grown at a rate in a range of 0.3 to 0.7 mm/min when growth of the monocrystal is started after completion of the melting operation. The method can grow the silicon monocrystal ingot with a high success rate in making the silicon monocrystal ingot dislocation free, and can improve productivity of silicon monocrystal ingots.

3 Claims, No Drawings

METHOD OF PRODUCING SILICON MONOCRYSTAL

BACKGROUND OF THE INVENTION

1. Field of the Invention

The present invention relates to a method of producing a silicon monocrystal in accordance with the Czochralski (CZ) method without performing a so-called necking operation.

2. Description of the Related Art

In the production of a silicon monocrystal in accordance with the Czochralski (CZ) method, a monocrystal of silicon has conventionally been used as a seed crystal. The seed crystal is brought into contact with silicon melt and is then pulled slowly while being rotated to thereby grow a silicon monocrystalline ingot. When the seed crystal is brought into contact with the silicon melt, slip dislocations are generated in the seed crystal at a high density as a result of thermal shock, and the dislocations propagate to the grown monocrystalline ingot. Therefore, in order to prevent the propagation of dislocations, there is performed a so-called necking operation in which the diameter of the crystal is decreased to about 3 mm, thereby forming a neck portion. Subsequently, the diameter of the crystal is increased to a desired diameter, and the silicon monocrystalline ingot is then pulled in a dislocation-free manner. The necking operation has been well known as a "Dash Necking Method," and use of this method has been a common practice in the case where a silicon monocrystal ingot is pulled in accordance with the CZ method.

Specifically, a conventional seed crystal is formed into a cylindrical shape having a diameter of about 8–20 mm or into a prismatic shape having sides of about 8–20 mm, and a cut-away portion or notch is formed for attachment to a seed crystal holder. The tip or lower end of the seed crystal, which end first comes into contact with silicon melt, is formed to have a flat surface. In order to safely pull a heavy monocrystalline ingot while sustaining the weight of the ingot, the seed crystal must have a dimension in the above-described range.

However, since the seed crystal having the above-described shape and dimension has a large heat capacity at the tip end which comes into contact with silicon melt, a steep temperature gradient is generated instantaneously within the crystal when the seed crystal comes into contact with the melt, so that slip dislocations are generated at a high density. Therefore, the above-described necking operation is required for growing a monocrystal while eliminating the dislocations.

However, in such a method, even when conditions for the necking operation are selected appropriately, the diameter of the crystal must be decreased to 4–6 mm or less in order to eliminate the dislocations. In such a case, the strength of the neck portion becomes insufficient to support a monocrystalline ingot whose weight has been increased with a recent increase in the diameter thereof, resulting in a high risk of fracture of the neck portion during the course of pulling of the monocrystalline ingot. This may result in a serious accident, such as dropping of the monocrystalline ingot.

In order to solve such a problem, the applicant of the present invention has proposed inventions disclosed in Japanese Patent Application Laid-Open (kokai) No. 5-139880 and Japanese Patent Application No. 8-87187. According to these inventions, the tip end of a seed crystal is formed into a wedge shape or is formed to have a hollow portion in order to reduce, to the extent possible, slip dislocation which would otherwise be generated when the seed crystal comes into contact with silicon melt. These inventions enable elimination of dislocations, even when the neck portion is formed to have a relatively large diameter, thereby increasing the strength of the neck portion.

Although the methods according to the cited inventions can increase the strength of the neck portion to some degree through an increase in the diameter of the neck portion, the methods still require performance of a necking operation, resulting in formation of a neck portion having slip dislocation. Therefore, in some cases, the strength of the neck portion of a monocrystalline ingot produced in accordance with either of these methods becomes insufficient for pulling the ingot if the monocrystalline ingot has a weight of 150 Kg or more as a result of recent increases in the diameter and length thereof. Accordingly, the methods do not thoroughly solve the problems involved in the prior art methods.

In view of the foregoing, the present applicant proposed a method of producing a silicon monocrystal, which method can make a growing crystal monocrystalline without performance of a necking operation for forming a neck portion, which would cause a problem in terms of strength (see Japanese Patent Application No. 9-17687). This method uses a seed crystal whose tip end has a sharp-pointed shape or a truncation thereof. The tip end of the seed crystal is gently brought into contact with the silicon melt, and the seed crystal is then lowered at a low speed in order to melt the tip end portion of the seed crystal until the size of the tip portion increases to a desired value. Subsequently, the seed crystal is pulled upwardly slowly in order to grow a silicon monocrystalline ingot having a desired diameter without performance of a necking operation.

According to this method, a contact area through which the tip end of the seed crystal is first brought into contact with the silicon melt is small, and the heat capacity of the tip end portion is small. Therefore, generation of thermal shock or a steep temperature gradient is prevented within the seed crystal, so that generation of slip dislocations is prevented. When the seed crystal is lowered at a low speed such that the tip end portion of the seed crystal is melted until the size of the tip portion increases to a desired value, a steep temperature gradient is not generated within the seed crystal. Therefore, no slip dislocation is generated within the seed crystal during the above-described melting operation. Finally, the seed crystal is slowly pulled upwardly in order to grow a silicon monocrystalline ingot. Since the seed crystal has a desired size and no dislocation, performance of a necking operation is not required, and the seed crystal therefore has a sufficient strength, allowing the seed crystal to be grown to a desired diameter to yield the silicon monocrystalline ingot.

As described above, in order to reduce the initial dislocation density, there have been proposed improved shapes for a seed crystal and improved necking methods which can maintain or increase the temperature of a seed crystal above the silicon melt or which can mitigate thermal shock upon contact with the silicon melt. However, since there is a limit to the thickness of a neck portion, the conventional techniques cannot cope with growth of a monocrystalline ingot having an increased diameter and an increased weight.

In view of this problem, there has been established the above-described dislocation-free seeding method; i.e., a method for bringing a seed crystal into contact with silicon melt for the purpose of initiating crystal growth, which does not require performance of a necking operation and which can cope with an increase in diameter and weight.

However, the problem involved in the dislocation-free seeding method is a rate of success in making a crystal dislocation free. That is, in this method, once a dislocation is introduced into a seed crystal, growth of a monocrystalline ingot cannot be continued or performed again unless the seed crystal is replaced with a new one. Therefore, increasing the success rate is considerably important. Further, even when seeding can be performed in a dislocation-free state, slip dislocation may be generated when the tapered tip end of a seed crystal is allowed to stand at a temperature near the melting point of silicon after the tip end has been melted to a predetermined distance, when the time required for initiating crystal growth or a growth rate during a transition period before the start of crystal growth is improper. The present inventors investigated the causes of such a phenomenon and found that even when the conventionally controlled factors such as shape of a seed crystal, a temperature maintaining time during which the seed crystal is held above melt (silicon melt), a melting speed, and a crystal growth rate are controlled appropriately, the above-described dislocation-free seeding cannot be performed with a sufficient success rate and with sufficient reproducibility.

SUMMARY OF THE INVENTION

The present invention was accomplished in view of the foregoing conventional problems, and an object of the present invention is to provide a method of producing a silicon monocrystal ingot in accordance with a dislocation-free seeding method without performance of a necking operation, which can grow the silicon monocrystal ingot with a high success rate in making the silicon monocrystal ingot dislocation free, and which can improve productivity of silicon monocrystal ingots having an increased diameter and weight.

In order to achieve the above-described object, the present invention provides a method of producing a silicon monocrystal using a Czochralski method in which a sharp tip end of a seed crystal is brought into contact with silicon melt and is melted, and the seed crystal is then pulled, without performance of a necking operation, in order to grow a silicon monocrystalline ingot below the seed crystal, wherein the operation of melting the seed crystal into the silicon melt is performed in a state in which a temperature in the vicinity of the surface of the silicon melt is set in a range between a temperature 25° C. higher than the melting point of silicon and a temperature 45° C. higher than the melting point of silicon.

As described above, in the method of growing a silicon monocrystal without performance of a necking operation, the operation of bringing a sharp tip end of a seed crystal into contact with silicon melt and melting the seed crystal into the silicon melt is performed in a state in which a temperature in the vicinity of the surface of the silicon melt is set in a range between a temperature 25° C. higher than the melting point of silicon and a temperature 45° C. higher than the melting point of silicon. In this case, the tip end portion of the seed crystal melts completely with a non-melted portion being left. In addition, since the temperature range is also suitable for switching to a subsequent pulling operation, generation of dislocations is prevented almost completely, so that the success rate in obtaining a dislocation-free crystal can be improved.

Preferably, the operation of growing the monocrystal is started within 0 to 10 minutes after completion of the operation of melting the sharp tip end of the seed crystal into the silicon melt. In this case, generation of dislocation after completion of the melting operation is prevented almost completely, so that the success rate in obtaining a dislocation-free crystal can be improved further. If the seed crystal is held above high temperature melt for a long time exceeding 10 minutes, dislocations are newly generated.

Preferably, the monocrystal is grown at a rate in a range of 0.3 to 0.7 mm/min when growth of the monocrystal is started after completion of the melting operation. In this case, generation of dislocation, which would otherwise occur when the growth of the monocrystal is started after completion of the melting operation, is prevented almost completely, so that the success rate in obtaining a dislocation-free crystal can be improved further. If the growth rate is greater than 0.7 mm/min or less than 0.3 mm/min, the shape of the crystal changes excessively, resulting in easy generation of dislocations within the crystal.

According to the present invention, the success rate in obtaining a dislocation-free crystal becomes 90% or higher, and a high degree of reproducibility and long-term stability are attained. Accordingly, the silicon monocrystalline production method of the present invention can cope with future increases in diameter, length, and weight of monocrystalline ingots, and greatly improves productivity and yield, while decreasing cost.

DESCRIPTION OF THE PREFERRED EMBODIMENT

An embodiment of the present invention will now be described; however, the present invention is not limited thereto.

The present inventors found that in the dislocation-free seeding method without performance of necking operation the success rate in obtaining a dislocation-free crystal sometimes does not reach a satisfactory level, and investigated the causes of this problem. As a result, the present inventors found that generation of dislocation is greatly affected by a temperature in the vicinity of the surface of melt when a tip end of a seed crystal is melted into the melt, the time (holding time) between completion of the melting operation and start of growth of a monocrystal, and a growth rate at the time when growth of the monocrystal is started. The present invention was achieved on the basis of this finding and through determination of proper conditions.

First, factors affecting the conventional dislocation-free seeding were extracted, and investigations and experiments were performed in relation to the factors in order to determine the following conditions for eliminating dislocations.

As shown in Table 1, the investigated factors were a time (A) during which a seed crystal is held above the melt surface before the seed crystal is brought into contact therewith, a rate (B) at which the tip end of the seed crystal is melted, a temperature (melting point+C) in the vicinity of the surface of silicon melt, a time (D) during which the tip end of the seed crystal is held at a fixed position after being melted, and a growth rate (E) at the time when growth of a monocrystal is started.

The tip end of a silicon monocrystal rod having a square cross section of 15×15 mm was tapered at 18° in a conical shape, and its surface was etched through use of a mixture of hydrofluoric acid and nitric acid to a depth of about 400 μm to obtain a seed crystal. A monocrystalline ingot having a diameter of 150 mm was grown through use of the seed crystal, and a success rate in making the monocrystalline ingot dislocation free was investigated.

Specifically, the above-described seed crystal was held for (A) minutes at a position 5 mm above the silicon melt whose temperature in the vicinity of the surface thereof had been set to a (melting point+C) ° C. Subsequently, the seed crystal was lowered into the melt at a rate of (B) mm/min in order to melt the tip end of the seed crystal. When the diameter of the seed crystal became 6 mm, the seed crystal was held at that position for (D) minutes. Subsequently, the seed crystal was pulled at a rate of (E) mm/min for growth of a monocrystal.

Table 1 shows the success rate in eliminating dislocations for the case where a monocrystal having a diameter of 150 mm is grown in the above-described manner. The success rate in eliminating dislocations (also called DF achievement rate) (%) is a percentage represented by the number of dislocation-free ingots with respect to the total number of experimentally pulled ingots.

If a crystal having a desired diameter is actually grown after seeding in order to investigate the success rate, the investigation becomes difficult because all the factors mutually affect the results. In view of the foregoing, the success rate in eliminating dislocations was checked during only a period when the operation of melting the tip end of the seed crystal was switched to the operation of growing a monocrystal. Specifically, in the actual experiment, a monocrystalline ingot having a desired diameter was grown to about 5 cm, and presence/absence of crystal habit lines was checked. In addition, after the monocrystalline ingot was separated from the melt surface, preferential etching was performed through use of Sirtl etching solution in order to check whether dislocation was generated at the tip end of the seed crystal.

TABLE 1

| Test No | Holding time A before melting (min) | Melting rate B (mm/min) | Temp. ° C. on melt surface (° C. above melting point) | Holding time D after melting (min) | Initial growth rate E (mm/min) | Success rate (%) |
|---|---|---|---|---|---|---|
| 1 | 5 | 2 | 40 | 5 | 0.3 | 95 |
| 2 | 30 | 2 | 40 | 5 | 0.3 | 95 |
| 3 | 60 | 2 | 40 | 5 | 0.3 | 95 |
| 4 | 5 | 0.5 | 40 | 5 | 0.3 | 95 |
| 5 | 5 | 5 | 40 | 5 | 0.3 | 95 |
| 6 | 5 | 2 | 20 | 5 | 0.8 | 10 |
| 7 | 5 | 2 | 25 | 5 | 0.6 | 85 |
| 8 | 5 | 2 | 30 | 5 | 0.5 | 90 |
| 9 | 5 | 2 | 45 | 5 | 0.3 | 90 |
| 10 | 5 | 2 | 50 | 5 | 0.2 | 30 |
| 11 | 5 | 2 | 40 | 10 | 0.3 | 90 |
| 12 | 5 | 2 | 40 | 20 | 0.3 | 50 |
| 13 | 5 | 2 | 40 | 60 | 0.3 | 15 |
| 14 | 5 | 2 | 40 | 5 | 0.2 | 30 |
| 15 | 5 | 2 | 40 | 5 | 0.7 | 90 |
| 16 | 5 | 2 | 40 | 5 | 0.8 | 40 |

From Table 1, the following relationships were found to exist between the factors A–E and the success rate in eliminating dislocations.

[1] No correlation exists between the success rate and the time (A) during which a seed crystal is held above melt surface before the seed crystal is brought into contact with the melt surface (see Test Nos. 1–3). The DF achievement rate neither decreases nor changes even when the seed crystal is held for 5 minutes or more.

[2] No correlation exists between the success rate and the rate (B) at which the tip end of the seed crystal is melted (see Test Nos. 1, 4, and 5). The DF achievement rate neither decreases nor changes even when the melting speed is alternately increased and decreased from a center value of 2 mm/min.

[3] A considerably close correlation exists between the success rate and the temperature (melting point+C) in the vicinity of the surface of silicon melt (see Test Nos. 1 and 6–10). When C becomes less than 25° C., the DF achievement rate decreases sharply, and when C exceeds 45° C., the DF achievement rate also decreases. Further, when the temperature becomes excessively high, the DF achievement rate sharply decreases, one cause of which is an excessive decrease in the growth rate (E). The low growth rate also affects productivity (see Test No. 10).

[4] A considerably close correlation exists between the success rate and the holding time (D) after completion of the melting operation (see Test Nos. 1, and 11–13). When the holding time (D) exceeds 10 minutes, the DF achievement rate decreases considerably.

[5] A considerably close correlation exists between the success rate and the growth rate (E) when growth of a monocrystal is started (see Test Nos. 1 and 14–15). When E becomes less than 0.3 mm/min, the DF achievement rate decreases sharply, and when E exceeds 0.7 mm/min, the DF achievement rate decreases considerably.

As described above, the success rate in eliminating dislocations is greatly affected by three factors, i.e., the temperature (melting point+C) in the vicinity of the surface of silicon melt, the holding time (D) after completion of the melting operation, and the initial growth rate (E). Therefore, if these factors are controlled to proper ranges, generation of dislocations within a crystal can be largely prevented, so that the high success rate in eliminating dislocations can be maintained with a high degree of reproducibility, which contributes to growth of especially a monocrystal having a large diameter. Therefore, productivity and yield can be improved, while cost can be decreased.

There will be described the first factor; i.e., the temperature in the vicinity of the surface of silicon melt when the sharpened tip end of a seed crystal is brought into contact with silicon melt in order to melt the tip end over a predetermined length. The temperature is set to be higher than a temperature 25° C. higher than the melting point of silicon (melting point is about 1420° C.) and lower than a temperature 45° C. higher than the melting point of silicon. When the temperature falls within this range, the tip end of the seed crystal can be quickly and completely melted with no non-melted portion remaining. In addition, the temperature range is proper for switching the operation to a subsequent pulling operation and dislocations are hardly generated, so that the success rate in eliminating dislocations is considerably high.

The reason why the success rate decreases at temperatures below (1420+25) ° C. is that at such temperatures, melting becomes insufficient and a non-melted portion may remain, so that part of melt becomes uneven, resulting in easy generation of dislocations. When the temperature exceeds (1420+45) ° C., a strong thermal shock is generated when the tip end of a seed crystal comes into contact with melt, so that dislocations are generated easily. In addition, as the temperature at which seeding is performed increases, the monocrystal growth rate decreases considerably, which affects productivity.

There will be described the second factor; i.e., the holding time (D) after completion of the melting operation. If the operation is shifted to a monocrystal growth operation within 0 to 10 minutes after completion of the melting operation, generation of dislocations is largely suppressed, so that the success rate in eliminating dislocations can be improved. The reason why the holding time (D) after completion of the melting operation is set within the above-described range is that even when the "C" of the above-described temperature (melting point+C) ° C. on melt surface is properly set within the range of 25–45° C., a holding time (D) greater than 10 minutes causes generation of dislocation within a crystal if the value of C is high (for example, 40° C.). In this case, the DF achievement rate decreases considerably (see Test Nos. 11–13). A conceivable reason for this phenomenon is that when a crystal is held on the melt without being pulled, the concentration of interstitial Si atoms in the crystal increases, resulting in generation of dislocations.

There will be described the third factor; i.e., the growth rate (E) when growth of a monocrystal is started. If, at the beginning of the monocrystal growth operation, a seed crystal is grown at a rate of 0.3–0.7 mm/min in order to grow the monocrystal to a length of about 3–20 mm, generation of dislocations is largely suppressed, so that the DF achievement rate can be increased. The reason why the growth rate (E) is set within the above-described range is as follows. In the case where the growth rate is greater than 0.7 mm/min or less than 0.3 mm/min, even when the temperature of the melt surface is 25 to 40° C. higher than the melting point of silicon and the holding time after completion of melting is less than 10 minutes, generation of dislocations occurs easily because the shape of the seed crystal changes excessively, resulting in a decreased DF achievement rate. Especially, when the growth rate is less than 0.3 mm/min, the time during which the crystal is held on the melt becomes long due to the above-described low growth rate, so that the concentration of interstitial Si atoms within the crystal becomes excessively high, resulting in possible generation of dislocations.

Among the factors that were initially considered to greatly affect the DF achievement rate, the time (A) during which a seed crystal is held above melt surface and the rate (B) at which the tip end of the seed crystal is melted were found to hardly affect the DF achievement rate.

When a seed crystal is held above the surface of melt, the temperature of the crystal increases to a certain temperature within a few minutes but does not increase further, and the temperature increase resulting from the operation of holding the seed crystal above the surface of melt is conceivably very small compared to a temperature difference generated upon contact of the tip end of the seed crystal with the melt surface.

Further, a conceivable reason why the success rate does not depend on the rate of melting the tip end of the seed crystal is that the effect of temperature is greater than the effect of the melting rate because of a large heat capacity of silicon melt.

Preferably, the seed crystal used in the dislocation-free seeding method according to the present invention is a seed crystal having a cylindrical or prismatic body portion and having a conical or pyramidal tip end, either pointed or truncated, which has been conventionally used for dislocation-free seeding. Accordingly, the phrase "a seed crystal having a pointed tip end" used in this specification encompasses seed crystals having the above-described shapes.

The present invention is not limited to the above-described embodiments. The above-described embodiments are mere examples, and those having the substantially same structure as that described in the appended claims and providing the similar action and effects are included in the scope of the present invention.

For example, in the above-described embodiment, there is described growth of a silicon monocrystal ingot having a diameter of 150 mm (6 inches). However, the dislocation-free seeding of the present invention can cope with a recent increase in diameter to 200 mm (8 inches) and further to 400 mm (16 inches). However, in the present invention, since necking operation is not conducted and slip dislocation is not generated, monocrystalline ingots of any diameter, length, and weight can in principle be pulled without use of a crystal holding apparatus if the diameter, length and weight do not exceed the physical limit of the silicon monocrystal itself.

The present invention can be applied not only to the ordinary CZ method but also to the MCZ method (Magnetic field applied Czochralski crystal growth method) in which a magnetic field is applied to silicon melt when a silicon monocrystal is pulled. Therefore, the term "Czochralski method" or "CZ method" encompasses not only the ordinary CZ method but also the MCZ method.

What is claimed is:

1. A method of producing a silicon monocrystal using a Czochralski method in which a sharp tip end of a seed crystal is brought into contact with silicon melt and is melted, and the seed crystal is then pulled, without performance of a necking operation, in order to grow a silicon monocrystalline ingot below the seed crystal, wherein the operation of melting the seed crystal into the silicon melt is performed in a state in which a temperature in the vicinity of the surface of the silicon melt is set in a range between a temperature 25° C. higher than the melting point of silicon and a temperature 45° C. higher than the melting point of silicon.

2. A method of producing a silicon monocrystal according to claim 1, wherein the operation of growing the monocrystal is started within 0 to 10 minutes after completion of the operation of melting the sharp tip end of the seed crystal into the silicon melt.

3. A method or producing a silicon monocrystal according to claim 1, wherein in that the monocrystal is grown at a rate in a range of 0.3 to 0.7 mm/min when growth of the monocrystal is started after completion of the melting operation.

* * * * *